(12) United States Patent
Lin et al.

(10) Patent No.: US 10,097,088 B2
(45) Date of Patent: Oct. 9, 2018

(54) SOFT-SWITCHING AUXILIARY CIRCUIT

(71) Applicant: INDUSTRIAL TECHNOLOGY RESEARCH INSTITUTE, Hsin-Chu (TW)

(72) Inventors: Chun-Chen Lin, Taichung (TW); Chih-Wei Ko, Taichung (TW); Yi-Ling Lin, Taichung (TW); Chien-Ming Wang, Taipei (TW)

(73) Assignee: INDUSTRIAL TECHNOLOGY RESEARCH INSTITUTE, Hsin-Chu (TW)

( * ) Notice: Subject to any disclaimer, the term of this patent is extended or adjusted under 35 U.S.C. 154(b) by 74 days.

(21) Appl. No.: 14/982,676

(22) Filed: Dec. 29, 2015

(65) Prior Publication Data

US 2017/0163153 A1 Jun. 8, 2017

(30) Foreign Application Priority Data

Dec. 8, 2015 (TW) .............................. 104141177 A

(51) Int. Cl.
*H02M 3/158* (2006.01)
*H03K 17/12* (2006.01)
(Continued)

(52) U.S. Cl.
CPC ......... *H02M 3/158* (2013.01); *H02M 3/1588* (2013.01); *H03K 17/122* (2013.01);
(Continued)

(58) Field of Classification Search
CPC ........ Y02B 70/1491; H02M 2001/342; H02M 3/158; H02M 2001/0058; H02M 3/335; H02M 3/33569; H03K 7/08
See application file for complete search history.

(56) References Cited

U.S. PATENT DOCUMENTS 6,525,513 B1 * 2/2003 Zhao ..................... H02M 3/158
323/222
8,203,322 B2 6/2012 Okubo et al.
(Continued)

FOREIGN PATENT DOCUMENTS

CN 2550960 Y 5/2003
CN 1574582 A 2/2005
(Continued)

OTHER PUBLICATIONS

Lei Jiang et al., A novel soft-switching bidirectional DC-DC converter with coupled inductors, IEEE Transactions on Industry Applications, 2013, 2730-2740, vol. 49, No. 6.
(Continued)

*Primary Examiner* — Adolf Berhane
*Assistant Examiner* — Henry Lee, III
(74) *Attorney, Agent, or Firm* — Locke Lord LLP; Tim Tingkang Xia, Esq.

(57) ABSTRACT

A soft-switching auxiliary circuit is provided, which may be applicable to a converter including a first main switch and a second main switch. The soft-switching auxiliary circuit may include a first auxiliary switch, a second auxiliary switch, a first energy adjustment module and a second energy adjustment module. By means of the first auxiliary switch and a second auxiliary switch, the first energy adjustment module and the second energy adjustment may properly store and adjust the energy of the converter; therefore, both the first main switch and the second main switch of the converter can achieve soft-switching.

12 Claims, 19 Drawing Sheets

(51) Int. Cl.
*H03K 17/16* (2006.01)
*H02M 1/00* (2006.01)
(52) U.S. Cl.
CPC ... *H03K 17/164* (2013.01); *H02M 2001/0058* (2013.01); *Y02B 70/1466* (2013.01); *Y02B 70/1491* (2013.01)

(56) References Cited

U.S. PATENT DOCUMENTS

| | | | |
|---|---|---|---|
| 8,547,712 | B2 | 10/2013 | Chang et al. |
| 8,836,385 | B2 | 9/2014 | Chen et al. |
| 8,922,964 | B2 | 12/2014 | Chuang et al. |
| 8,970,186 | B2 | 3/2015 | Manabe et al. |
| 8,994,468 | B2 | 3/2015 | Chien et al. |
| 9,419,522 | B1 * | 8/2016 | Khaligh ............... H02M 3/158 |
| 2007/0230228 | A1 * | 10/2007 | Mao ............... H02M 3/156 363/89 |
| 2013/0161708 | A1 | 6/2013 | Peng et al. |
| 2015/0162845 | A1 | 6/2015 | Lee et al. |

FOREIGN PATENT DOCUMENTS

| | | | |
|---|---|---|---|
| CN | 101056071 | A | 10/2007 |
| CN | 200990558 | Y | 12/2007 |
| CN | 101132151 | A | 2/2008 |
| CN | 102223062 | A | 10/2011 |
| CN | 202183740 | U | 4/2012 |
| CN | 204231185 | U | 3/2015 |
| CN | 104753355 | A | 7/2015 |
| TW | I262646 | B | 9/2006 |
| TW | I436567 | B | 5/2014 |
| TW | I447405 | B | 8/2014 |
| TW | I454038 | B | 9/2014 |
| TW | I455474 | B | 10/2014 |
| TW | 201517485 | A | 5/2015 |
| TW | I489750 | B | 6/2015 |

OTHER PUBLICATIONS

Abdolmajid Shahsavary Babokany et al., A review of bidirectional dual active bridge converter, IEEE, 2012.
David Reusch et al., Evaluation of gallium nitride transistors in high frequency resonant and soft-switching DC-DC converters, IEEE, 2014, 464-470.
Jun-Gu Kim et al., High-efficiency bidirectional soft switching DC-DC converter, IEEE, 2010, 2905-2911.
Yu Du et al., Review of non-isolated bi-directional DC-DC converters for plug-in hybrid electric vehicle charge station application at municipal parking decks, IEEE, 2010, 1145-1151.
G. Hua et al., Soft-switching techniques in PWM converters, IEEE Transactions on Industrial Electronics, 1995, 595-603, vol. 42, No. 6.
Intellectual Property Office, Ministry of Economic Affairs, R.O. C, "Office Action", dated Sep. 13, 2016, Taiwan.

* cited by examiner

SOFT-SWITCHING AUXILIARY CIRCUIT

CROSS REFERENCE TO RELATED APPLICATION

All related applications are incorporated by reference. The present application is based on, and claims priority from, Taiwan Application Serial Number 104141177, filed on Dec. 8, 2015, the disclosure of which is hereby incorporated by reference herein in its entirety.

TECHNICAL FIELD

The technical field relates to an auxiliary circuit, in particular to a soft-switching auxiliary circuit.

BACKGROUND

In general, the switching of the main switch of a converter is hard-switching, which will cause serious loss. For the purpose of solving the above problem, soft-switching technology is developed. Generally speaking, the way to implement soft-switching technology is to integrate an auxiliary circuit with the circuit of a converter for the converter to achieve soft-switching (i.e. zero-current switching and zero-voltage switching).

There are many currently available soft-switching circuits are developed; for example, Taiwan Patent Publication No. 201436437 discloses a high-efficiency bidirectional single-input and multi-outputs DC/DC converter; Taiwan Patent Publication No. 200703857 discloses as high-efficiency bidirectional converter for power sources with great voltage diversity; China Patent Publication No. 104143919 discloses a bidirectional DC converter; however, the above currently available soft-switching circuits still have a lot of shortcomings to be overcome.

SUMMARY

A soft-switching auxiliary circuit is provided, which may be applicable to a converter with a first main switch and a second main switch; the soft-switching auxiliary circuit may include a first auxiliary switch, a first energy adjustment module, a second energy adjustment module and a second auxiliary circuit. One end of the first auxiliary switch may be coupled to one end of the first main switch via a first node. One end of the first energy adjustment module may be coupled to the other end of the first auxiliary switch via a second node. One end of the second energy adjustment module may be coupled to the other end of the first energy adjustment module via a third node, and the other end of the first main switch may be coupled to one end of the second main switch. One end of the second auxiliary switch may be coupled to the other end of the second energy adjustment module via a fourth switch, and the other end of the second auxiliary switch may be coupled to the other end of the second main switch via a fifth node.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DETAILED DESCRIPTION

Figure 1:
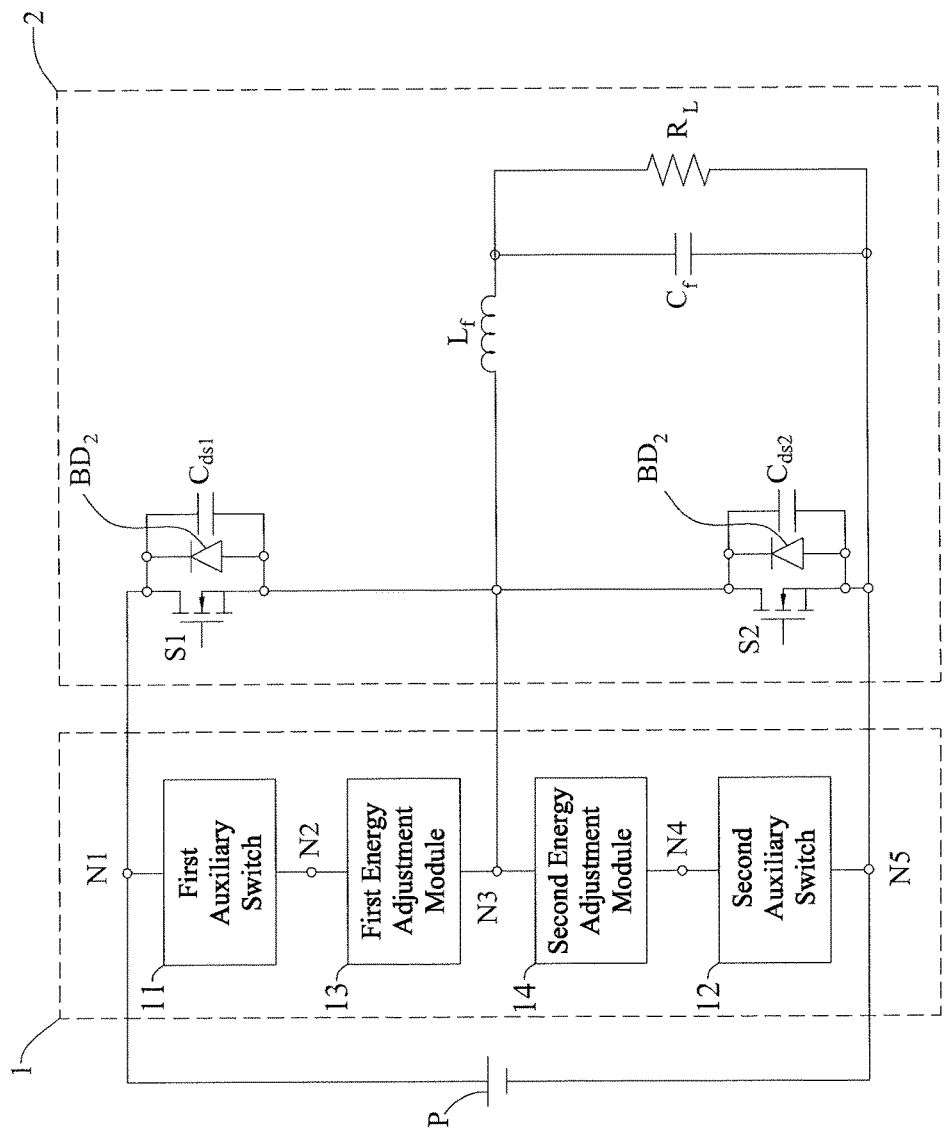
FIG. 1 is a schematic view of a soft-switching auxiliary circuit of the first embodiment in accordance with the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Referring now to FIG. 1, FIG. 1 shows a schematic view of a soft-switching auxiliary circuit of the first embodiment in accordance with the present disclosure. As shown in FIG. 1, the soft-switching auxiliary 1 may be applicable to a half-bridge converter 2, which may include a first main switch S1 and a second main switch S2; in other embodiments, the soft-switching auxiliary circuit 1 may be also applicable to other different converters. The soft-switching auxiliary circuit 1 may include a first auxiliary switch 11, a second auxiliary switch 12, a first energy adjustment module 13 and a second energy adjustment module 14; in an exemplary embodiment, the first energy adjustment module 13 and the second energy adjustment module 14 may be DC-link resonant circuits.

One end of the first auxiliary switch 11 may be coupled to one end of the first main switch S1 and the positive electrode of the power source P via a first node N1; the other end of the first auxiliary switch 11 may be coupled to one end of the first energy adjustment module 13 via a second node N2.

The other end of the first energy adjustment module 13 may be coupled to one end of the second energy adjustment module 14 via a third node N3; the other end of the first main switch S1 and one end of the second main switch S2 may be coupled to the third node N3.

The other end of the second auxiliary switch 12 may be coupled to the other end of the second main switch S2 via a fifth node N5.

As described above, the embodiment discloses a novel soft-switching auxiliary circuit, which may include two symmetrical auxiliary switches and two symmetrical energy adjustment modules. The two auxiliary switches and two energy adjustment modules can properly store and adjust the energy of the converter, so both the first main switch S1 and the second main switch S2 of the converter 2 can achieve soft-switching; accordingly, the switching loss of the converter 2 can be minimized and the performance of the converter 2 can be significantly improved.

Figure 2:
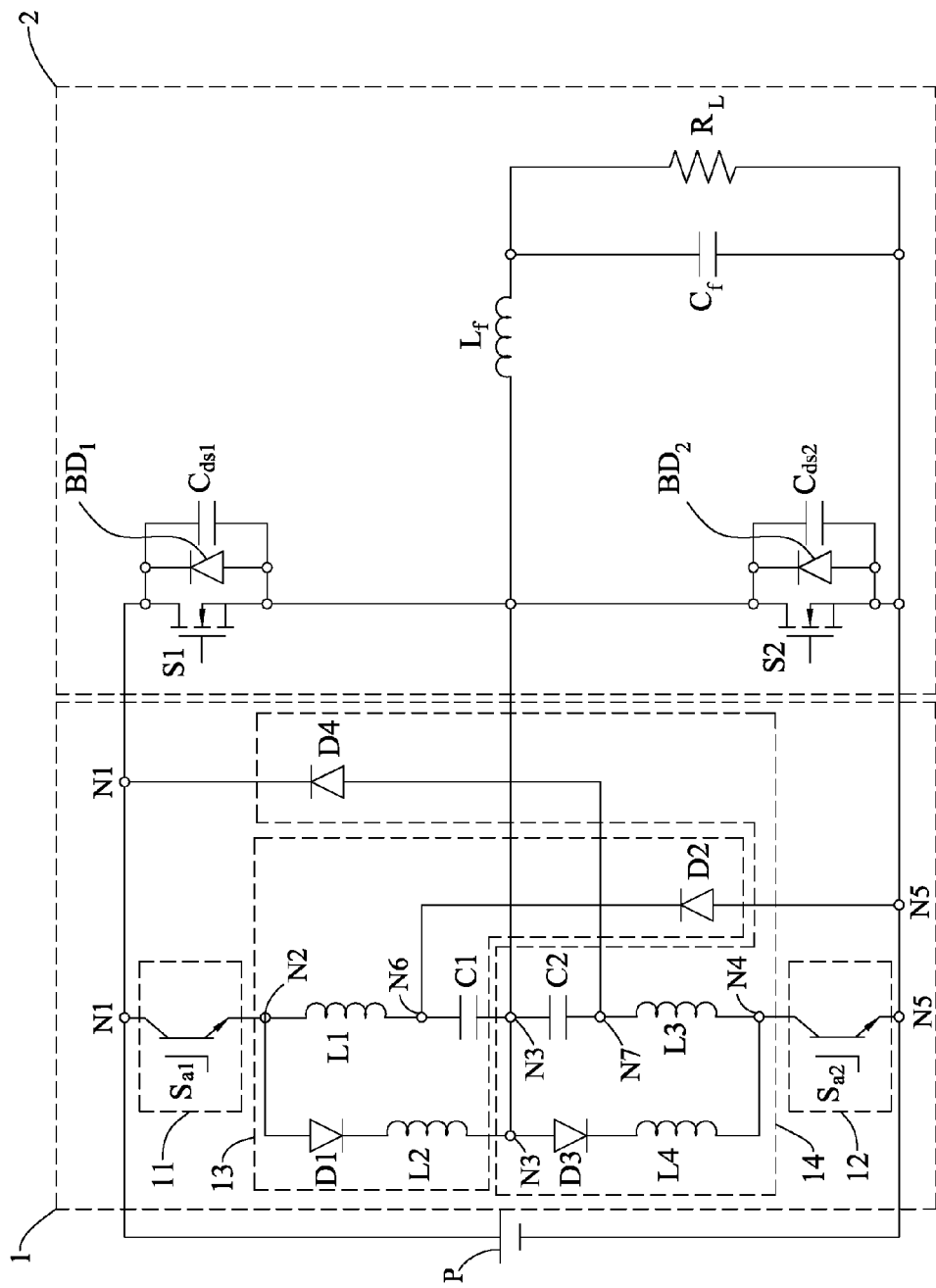
FIG. 2 is a first schematic view of a soft-switching auxiliary circuit of the second embodiment in accordance with the present disclosure.

Referring now to FIG. 2, FIG. 2 shows a first schematic view of a soft-switching auxiliary circuit of the second embodiment in accordance with the present disclosure. As shown in FIG. 2, the soft-switching auxiliary 1 may be applicable to a half-bridge converter 2, which may include a first main switch S1 and a second main switch S2; in other embodiments, the soft-switching auxiliary circuit 1 may be also applicable to other different converters. The soft-switching auxiliary circuit 1 may include a first auxiliary switch 11, a second auxiliary switch 12, a first energy adjustment module 13 and a second energy adjustment module 14.

More specifically, the first auxiliary switch 11 may include a first diode $S_{a1}$. The second energy adjustment module 13 may include a first inductor L1, a second inductor L2, a first capacitor C1, a first diode D1 and a second diode D2. The second energy adjustment module 14 may include a third inductor L3, a fourth inductor L4, a second capacitor C2, a third diode D3 and a fourth diode D4. The second auxiliary switch 12 may include a second diode $S_{a2}$.

Regarding the first auxiliary switch 11, the first transistor $S_{a1}$ may be a bipolar junction transistor (BJT); the collector of the first diode $S_{a1}$ may be coupled to a first node N1, and the emitter of the first transistor $S_{a1}$ may be coupled to a second node N2.

Regarding the first energy adjustment module 13, one end of the first inductor L1 may be coupled to the second node N2, and the other end of the first inductor L1 may be coupled to one end of the first capacitor C1 via a six node N6; the other end of the first capacitor C1 may be coupled to a third node N3; the positive electrode of the first diode D1 may be coupled to the second node N2, and the negative electrode of the first diode D1 may be coupled to one end of the second inductor L2; the other end of the second inductor L2 may be coupled to the third node N3; the positive electrode of the second diode D2 may be coupled to a fifth node N5, and the negative electrode of the second diode D2 may be coupled to the sixth node N6.

Regarding the second energy adjustment module 14, one end of the second capacitor C2 may be coupled to the third node N3, and the other end of the second capacitor C2 may be coupled to one end of the third inductor L3 via a seventh node N7; the other end of the third inductor L3 may be coupled to a fourth node N4; the positive electrode of the second diode D2 may be coupled to the fifth node N5, and the negative electrode of the second diode D2 may be coupled to one end of the fourth inductor L4; the other end of the fourth inductor L4 may be coupled to the fourth node N4; the negative electrode of the fourth diode D4 may be coupled to the first node N1, and the positive electrode of the fourth diode D4 may be coupled to the seventh node N7.

Regarding the second auxiliary switch 12, the second transistor $S_{a2}$ may be a bipolar junction transistor; the collector of the second transistor $S_{a2}$ may be coupled to the fourth node N4, and the emitter of the second transistor $S_{a2}$ may be coupled to the fifth node N5.

Referring now to FIG. 3~FIG. 10, FIG. 3~FIG. 10 show second~ninth schematic views of a soft-switching auxiliary circuit of the second embodiment in accordance with the present disclosure. FIG. 3~FIG. 10 illustrate the operation process of the soft-switching auxiliary circuit 1 of the embodiment; the operation process may be divided into 8 stages.

Figure 3:
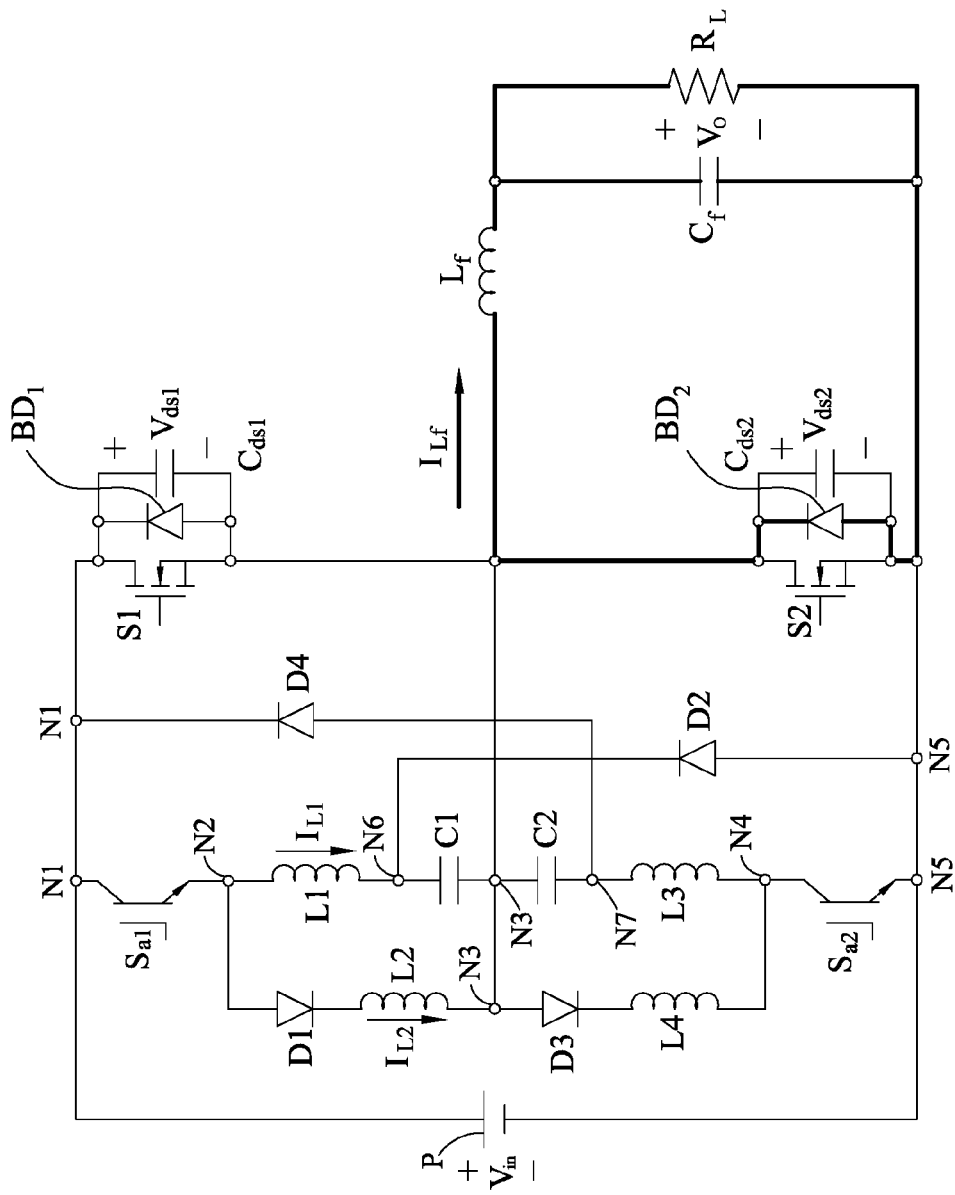
FIG. 3 is a second schematic view of a soft-switching auxiliary circuit of the second embodiment in accordance with the present disclosure.

As shown in FIG. 3, during the first stage, the initial statuses of both the first main switch S1 and the second main switch S2 are off; the voltage $V_{ds1}$ of the capacitor $C_{ds1}$ is $V_{in}$ and the voltage $V_{ds2}$ of the capacitor $C_{ds2}$ is 0. Then, the second main switch S2 is turned on, and then the current can flow through the second main switch S2 and its body diode $BD_2$.

Figure 4:
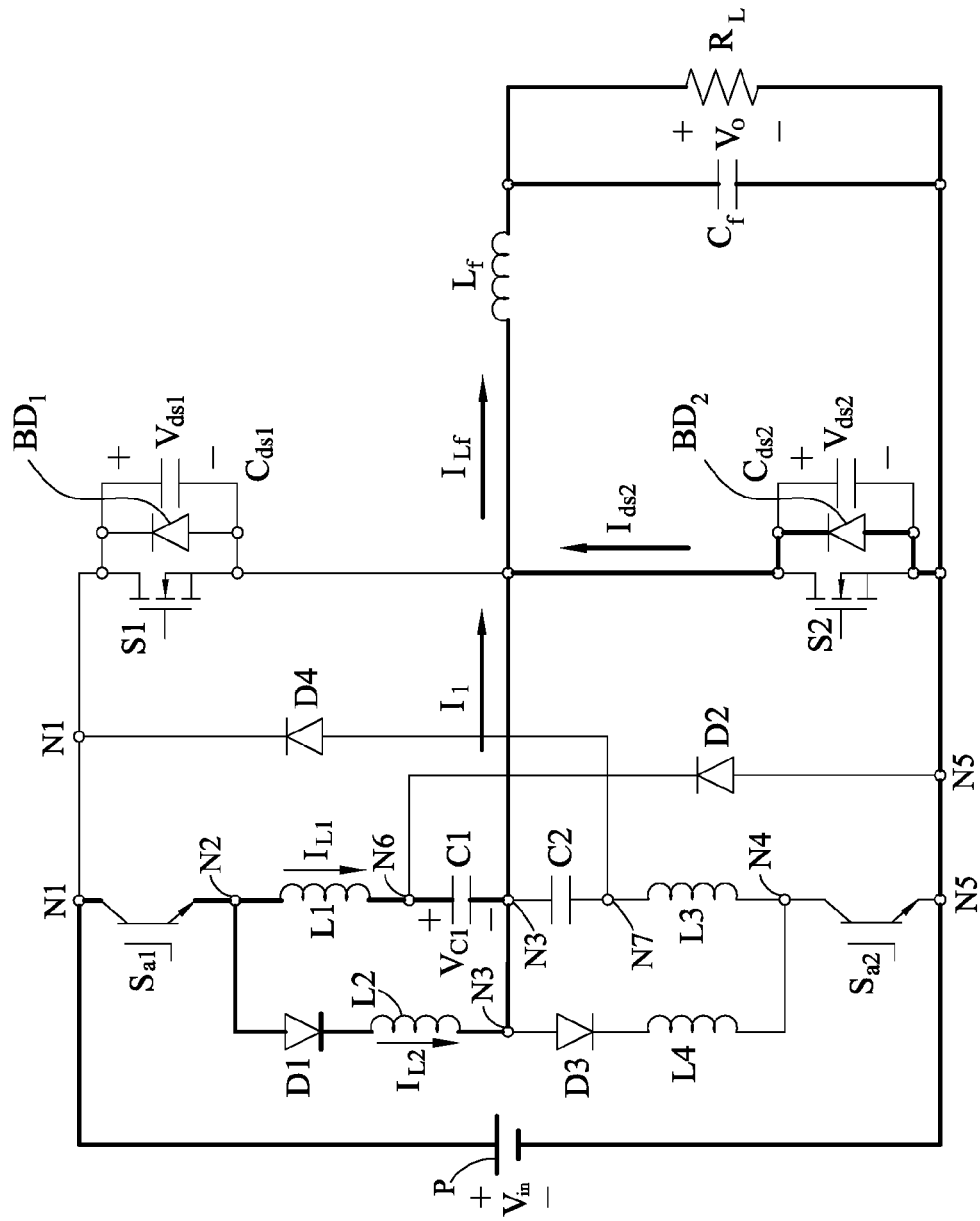
FIG. 4 is a third schematic view of a soft-switching auxiliary circuit of the second embodiment in accordance with the present disclosure.

As shown in FIG. 4, during the second stage, for the purpose of switching the first main switch S1 to be on under zero-voltage switching status, the first transistor $S_{a1}$ needs to be activated. Under ideal condition, the voltage $V_{ds2}$ of the capacitor $C_{ds2}$ is 0, the voltage of the first inductor L1 is $V_{in}$, and its current $I_{L1}$ linearly increases; now, the first inductor L1 and the first capacitor C2 begin to resonate; therefore, as shown by the arrows in FIG. 4, the current I1 gradually increases. The current I1 plus the current $I_{ds2}$ is the current $I_{Lf}$; assume the current $I_{Lf}$ is constant, the current $I_{Lf}$ is equal to the current $I_{ds2}$ because the current I1 is 0 at the beginning. Afterward, if the current I1 increases to be equal to the current $I_{Lf}$, the current Ids2 is 0, which causes the body diode $BD_2$ of the second main switch S2 to be cut off.

Figure 5:
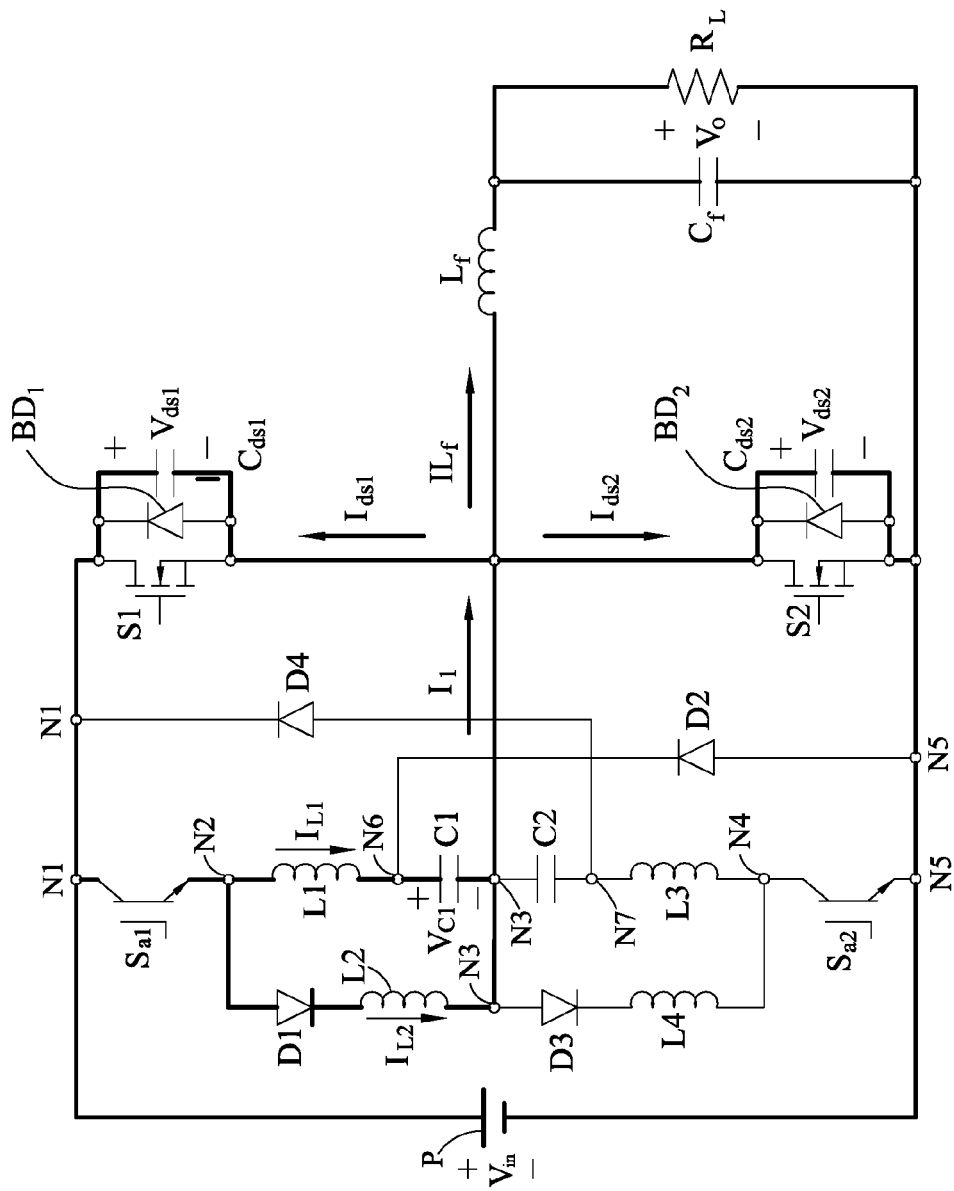
FIG. 5 is a fourth schematic view of a soft-switching auxiliary circuit of the second embodiment in accordance with the present disclosure.

As shown in FIG. 5, during the third stage, the capacitor $C_{ds1}$ and the capacitor $C_{ds2}$ start to resonate with the resonant circuit; at this time, the directions of the current I1, the current $I_{ds2}$ and the current $I_{ds1}$ are as shown by the arrows in FIG. 5; therefore, the capacitor $C_{ds2}$ is being charged and the capacitor $C_{ds1}$ is being discharged. The body diode $BD_2$ of the first main switch S1 is turned on until the voltage $V_{ds1}$ of the capacitor $C_{ds1}$ decreases to be 0.

Figure 6:
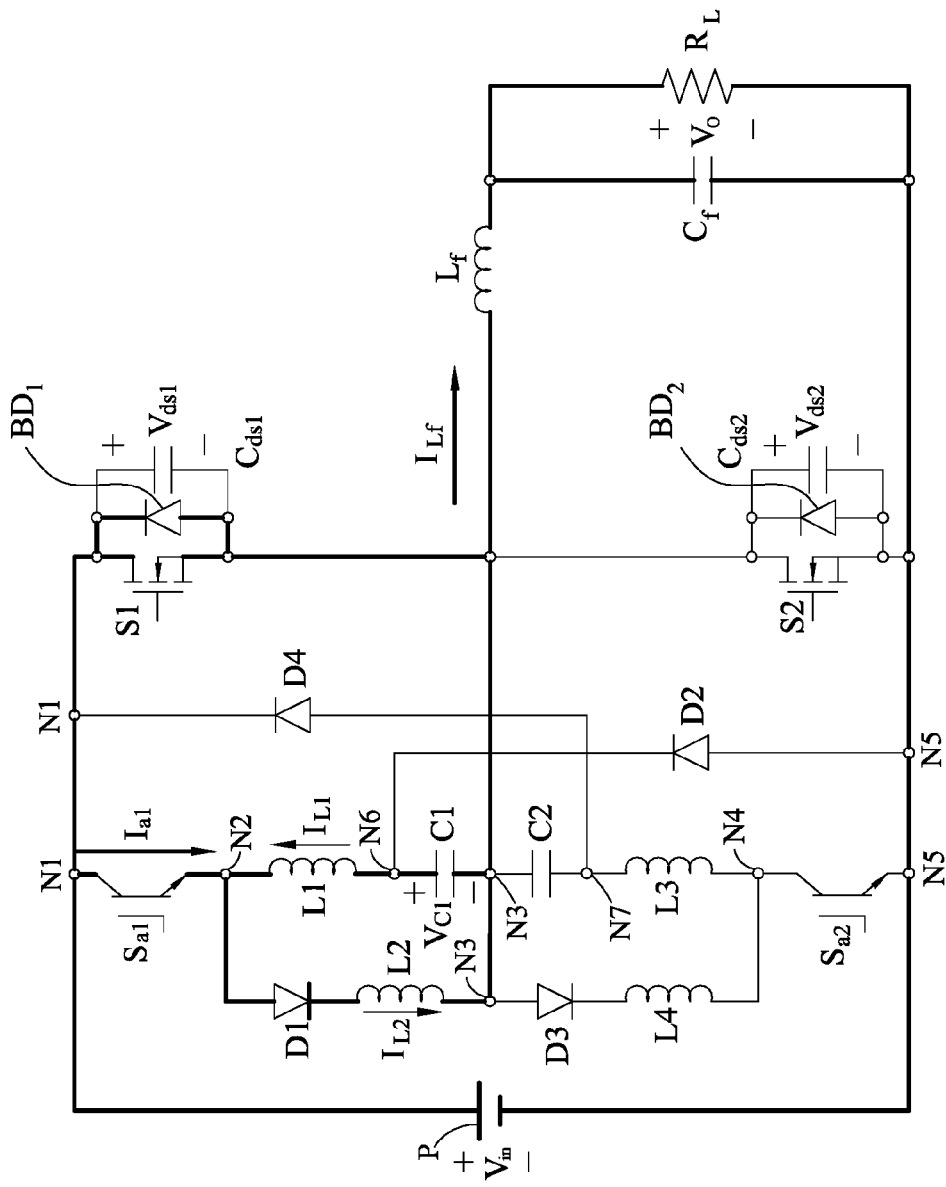
FIG. 6 is a fifth schematic view of a soft-switching auxiliary circuit of the second embodiment in accordance with the present disclosure.

As shown in FIG. 6, during the fourth stage, when the current $I_{L1}$ is equal to the current $I_{L2}$, the current $L_{a1}$ flowing through the first transistor $S_{a1}$ is 0.

Figure 7:
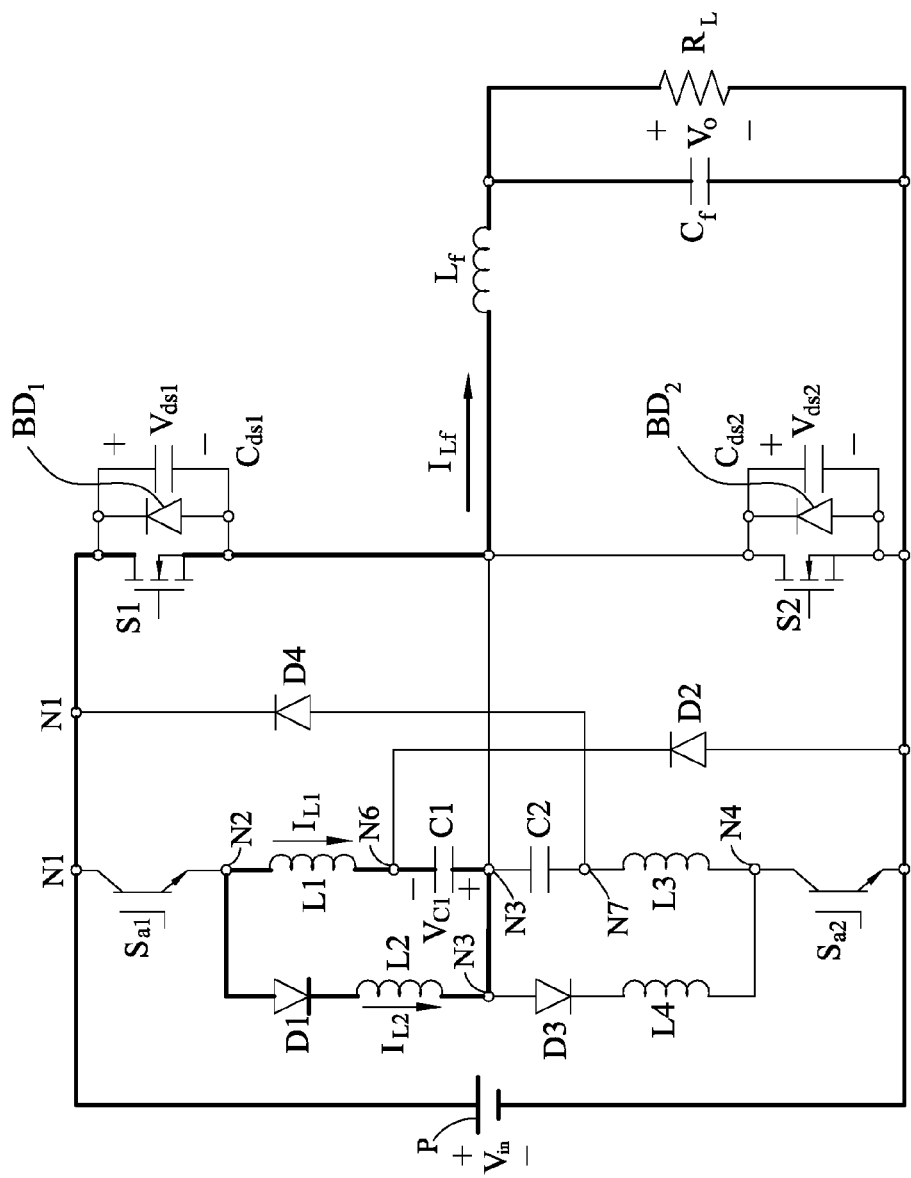
FIG. 7 is a sixth schematic view of a soft-switching auxiliary circuit of the second embodiment in accordance with the present disclosure.

As shown in FIG. 7, during the fifth stage, the first transistor $S_{a1}$ can be cut off under zero-current switching status; after the energy of the first inductor L1 and the second inductor L2 is completely recollected by the first capacitor C1, the first diode D1 is cut off.

Figure 8:
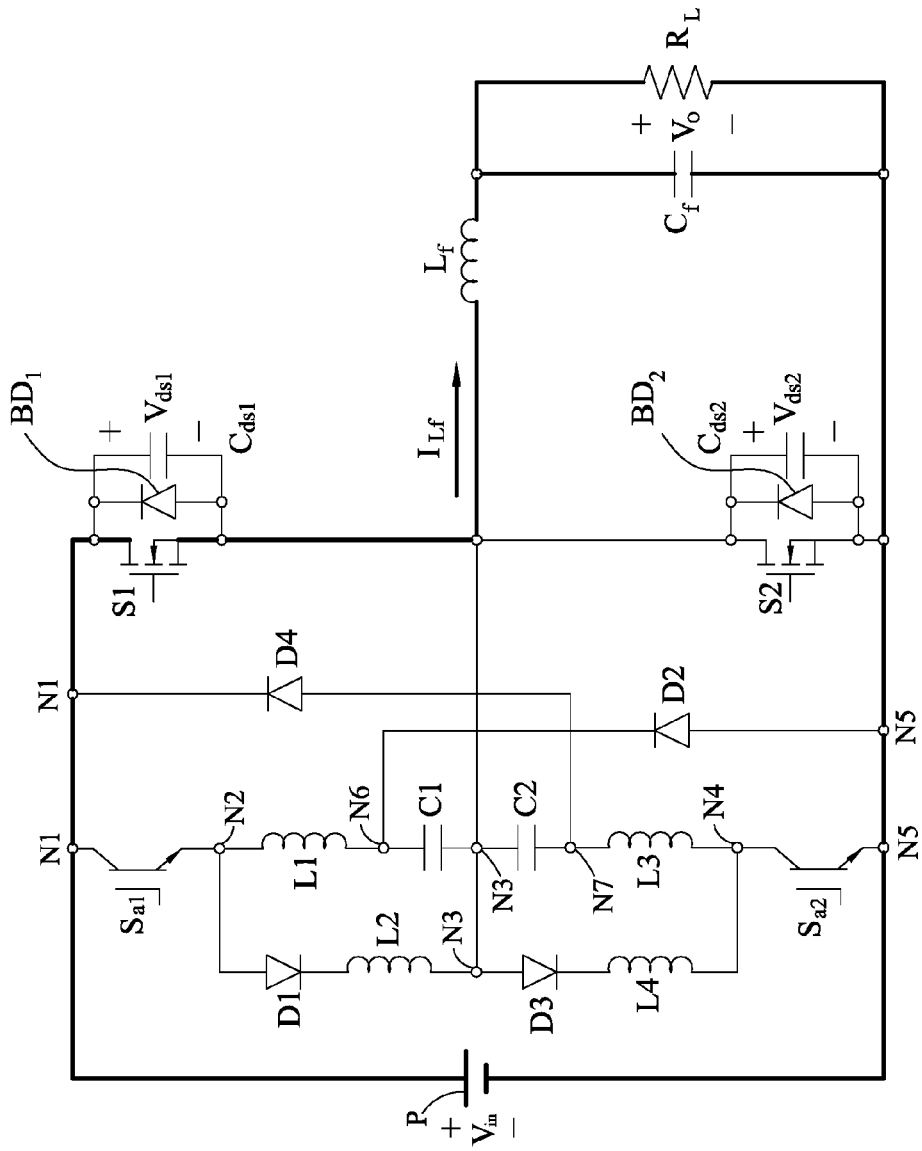
FIG. 8 is a seventh schematic view of a soft-switching auxiliary circuit of the second embodiment in accordance with the present disclosure.

As shown in FIG. 8, during the sixth stage, when the energy of the first inductor L1 and the second inductor L2 is completely recollected by the first capacitor C1, the duty cycle of the first main switch S1 ends and the first main switch S1 can be directly cut off; the capacitor $C_{ds1}$ can prevent the first main switch S1 from being switched under hard-switching status.

Figure 9:
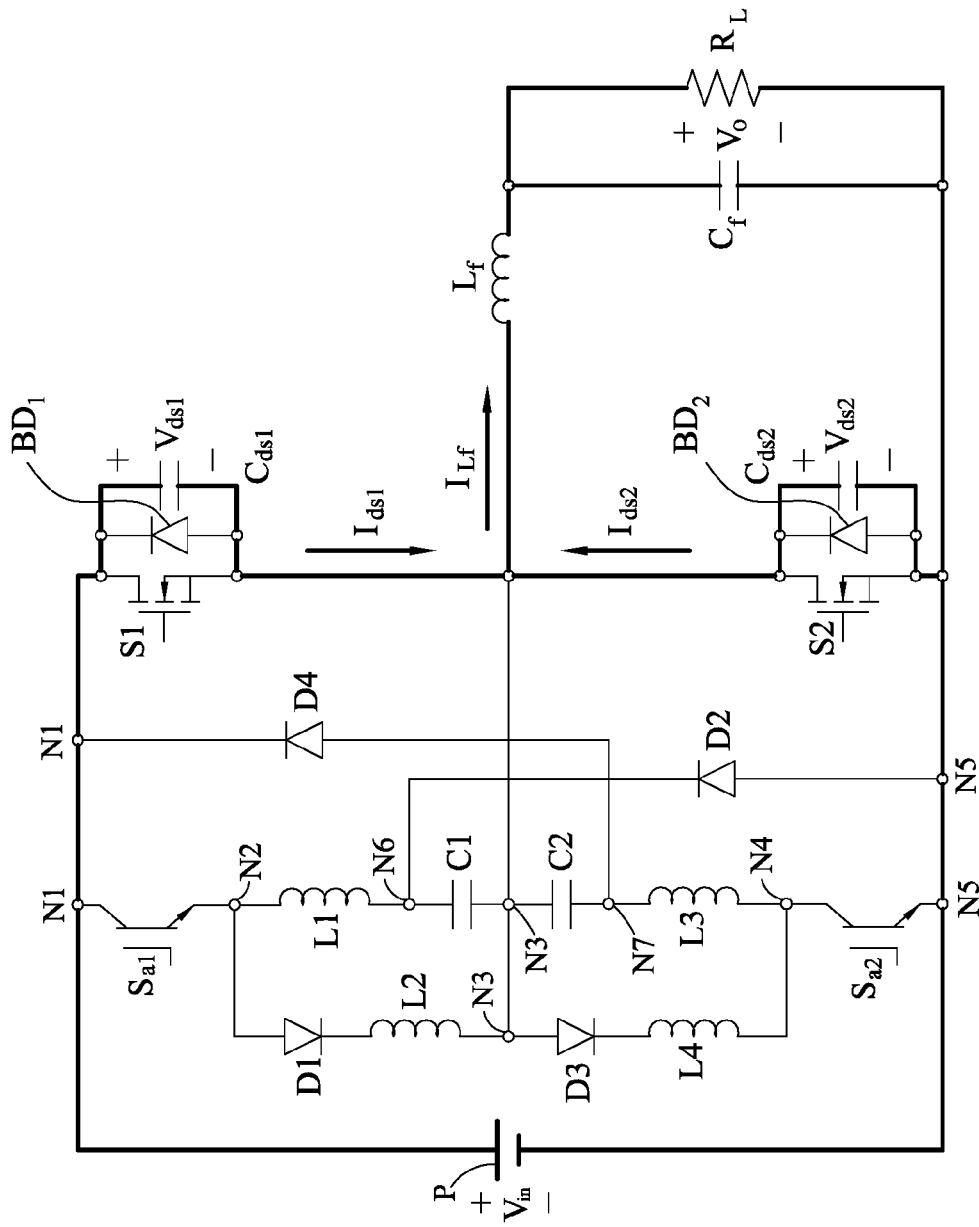
FIG. 9 is an eighth schematic view of a soft-switching auxiliary circuit of the second embodiment in accordance with the present disclosure.

As shown in FIG. 9, during the seventh stage, the capacitor $C_{ds1}$ can be charged by the voltage $V_{in}$ of the power source P, and the capacitor $C_{ds2}$ is being discharged; the current directions are shown by the arrows in the FIG. 9.

Figure 10:
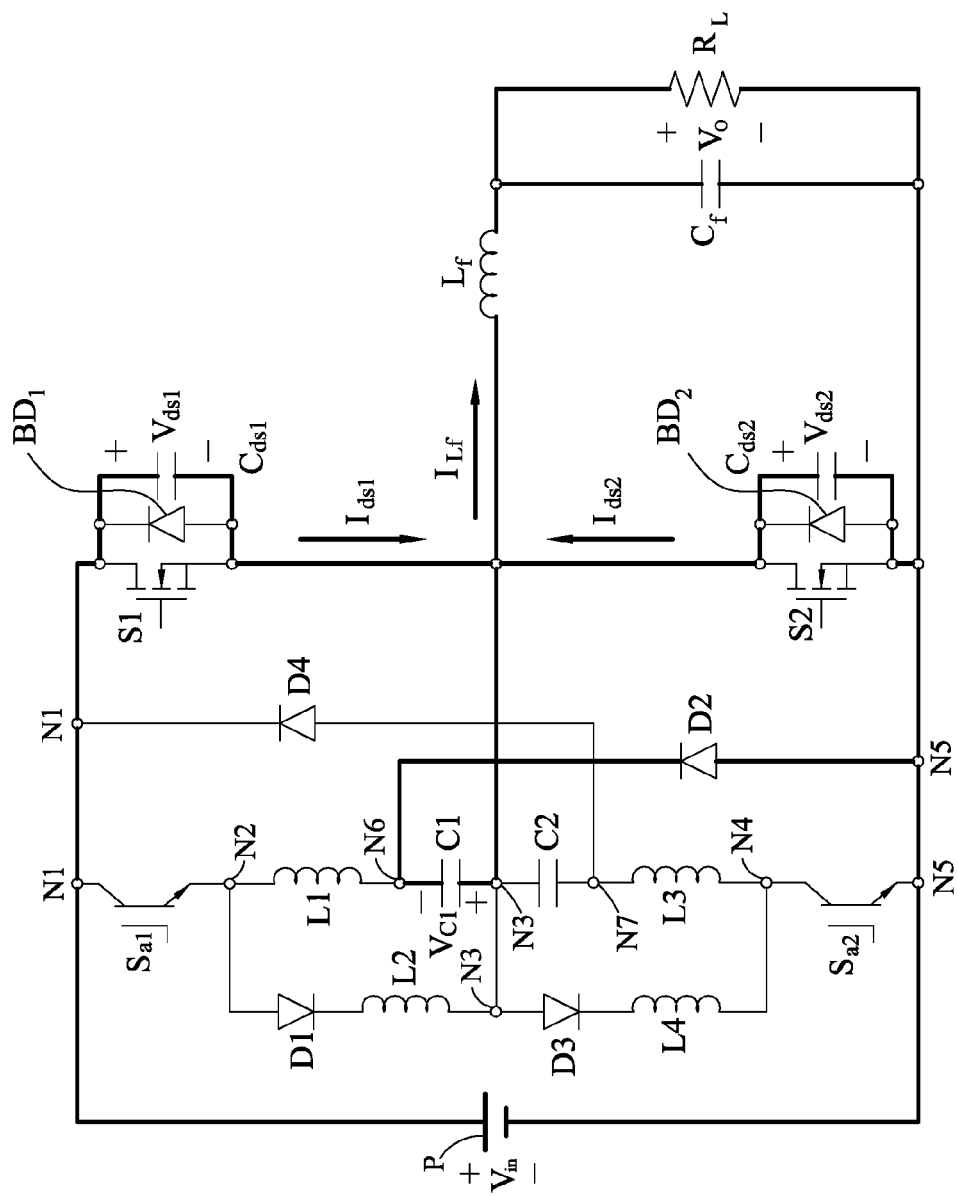
FIG. 10 is a ninth schematic view of a soft-switching auxiliary circuit of the second embodiment in accordance with the present disclosure.

As shown in FIG. 10, during the eighth stage, when the voltage $V_{ds1}$ of the capacitor $C_{ds2}$ decreases to be equal to the voltage $V_{C1}$ of the first capacitor C1, the second diode D2 is turned on. At this moment, the capacitor $C_{ds2}$ is being discharged, the first capacitor C1 is being discharged, and the capacitor $C_{ds1}$ is being charged; until the voltage $V_{ds1}$ of the capacitor $C_{ds1}$ increases to be $V_{in}$, and the voltage $V_{ds2}$ of the capacitor $C_{ds2}$ decreases to be 0, the body diode $BD_2$ of the second main switch S2 is turned on; then, the circuit returns to the status of the first stage. The operation process of the second man switch S2 is similar to the above process, so will be described herein.

As described above, by means of the soft-switching auxiliary circuit 1, both the first main switch S1 and the second main switch S2 of the half-bridge converter 2 can achieve soft-switching to minimize the switching loss; therefore, the performance of the half-bridge converter 2 can be significantly improved.

It is worthy to point out that most currently available soft-switching auxiliary circuits adopt single-directional structure, so the application of these soft-switching auxiliary circuit is limited. On the contrary, according to one embodiment of the present disclosure, the soft-switching auxiliary circuit may include two auxiliary switches and two energy adjustment modules, which may form a bidirectional structure; therefore, the soft-switching auxiliary circuit can be more comprehensive in use.

Also, most currently available soft-switching auxiliary circuits adopt isolation structure; in other words, a transformer should be integrated into these soft-switching auxiliary circuits, which significantly increase the size and the cost of these soft-switching auxiliary circuits. On the contrary, according to one embodiment of the present disclosure, the soft-switching auxiliary circuit may be integrated into a converter without a transformer; therefore, the size and the cost of the soft-switching auxiliary circuit can be effectively reduced.

Besides, most currently available soft-switching auxiliary circuits are customized, so it is impossible to directly integrate these soft-switching auxiliary circuits into different converters; therefore, the application of these soft-switching auxiliary circuits is limited. On the contrary, according to one embodiment of the present disclosure, the soft-switching auxiliary circuit may be integrated with the original circuit of a converter; therefore, it is not necessary to redesign the circuit of the converter; accordingly, the soft-switching auxiliary circuit can be more convenient and universal in use.

Moreover, most currently available soft-switching auxiliary circuits cannot prevent voltage surge from generating during the switching of the main switch of a converter, so the converter cannot completely achieve soft-switching. On the contrary, according to one embodiment of the present disclosure, the soft-switching auxiliary circuit adopts a special structure with two auxiliary switches and two energy adjustment modules, which can effectively prevent voltage surge from generating during the switching of the main switch of a converter; therefore, the performance of the converter can be significantly improved.

Figure 11:
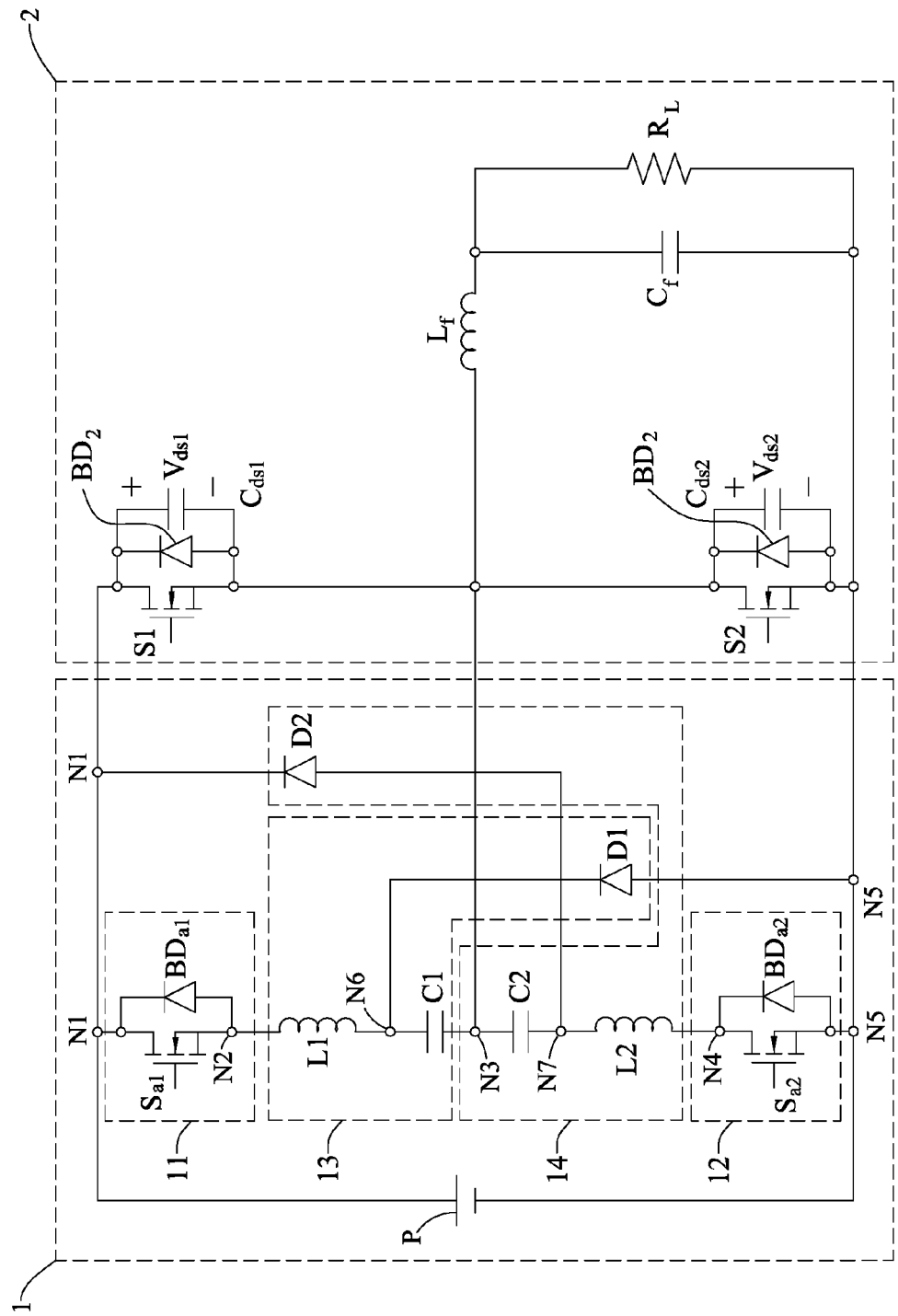
FIG. 11 is a first schematic view of a soft-switching auxiliary circuit of the third embodiment in accordance with the present disclosure.

Referring now to FIG. 11, FIG. 11 shows a first schematic view of a soft-switching auxiliary circuit of the third embodiment in accordance with the present disclosure. As shown in FIG. 11, the soft-switching auxiliary 1 may be applicable to a half-bridge converter 2, which may include a first main switch S1 and a second main switch S2. The soft-switching auxiliary circuit 1 may include a first auxiliary switch 11, a second auxiliary switch 12, a first energy adjustment module 13 and a second energy adjustment module 14.

More specifically, the first auxiliary switch 11 may include a first transistor $S_{a1}$. The second energy adjustment module 13 may include a first inductor L1, a first capacitor C1 and a first diode D1. The second energy adjustment module 14 may include a second inductor L2, a second capacitor C2 and a second diode D2. The second auxiliary switch 12 may include a second transistor $S_{a2}$.

Regarding the first auxiliary switch 11, the first transistor $S_{a1}$ may be a field-effect transistor (FET); the drain of the first diode $S_{a1}$ may be coupled to a first node N1, and the source of the first transistor $S_{a1}$ may be coupled to a second node N2.

Regarding the first energy adjustment module 13, one end of the first inductor L1 may be coupled to the second node N2, and the other end of the first inductor L1 may be coupled to one end of the first capacitor C1 via a six node N6; the other end of the first capacitor C1 may be coupled to a third node N3; the positive electrode of the first diode D1 may be coupled to a fifth node N5, and the negative electrode of the first diode D1 may be coupled to the sixth node N6.

Regarding the second energy adjustment module 14, one end of the second capacitor C2 may be coupled to the third node N3, and the other end of the second capacitor C2 may be coupled to one end of the second inductor L2 via a seventh node N7; the other end of the second inductor L2 may be coupled to a fourth node N4; the positive electrode of the second diode D2 may be coupled to the seventh node N7, and the negative electrode of the second diode D2 may be coupled to a first node N1.

Regarding the second auxiliary switch 12, the second transistor $S_{a2}$ may be a field-effect transistor; the drain of the second transistor $S_{a2}$ may be coupled to the fourth node N4, and the source of the second transistor $S_{a2}$ may be coupled to the fifth node N5.

Referring now to FIG. 12~FIG. 19, FIG. 12~FIG. 19 show second~ninth schematic views of a soft-switching auxiliary circuit of the third embodiment in accordance with the present disclosure. FIG. 12~FIG. 19 illustrate the operation process of the soft-switching auxiliary circuit 1 of the embodiment; the operation process may be divided into 8 stages.

Figure 12:
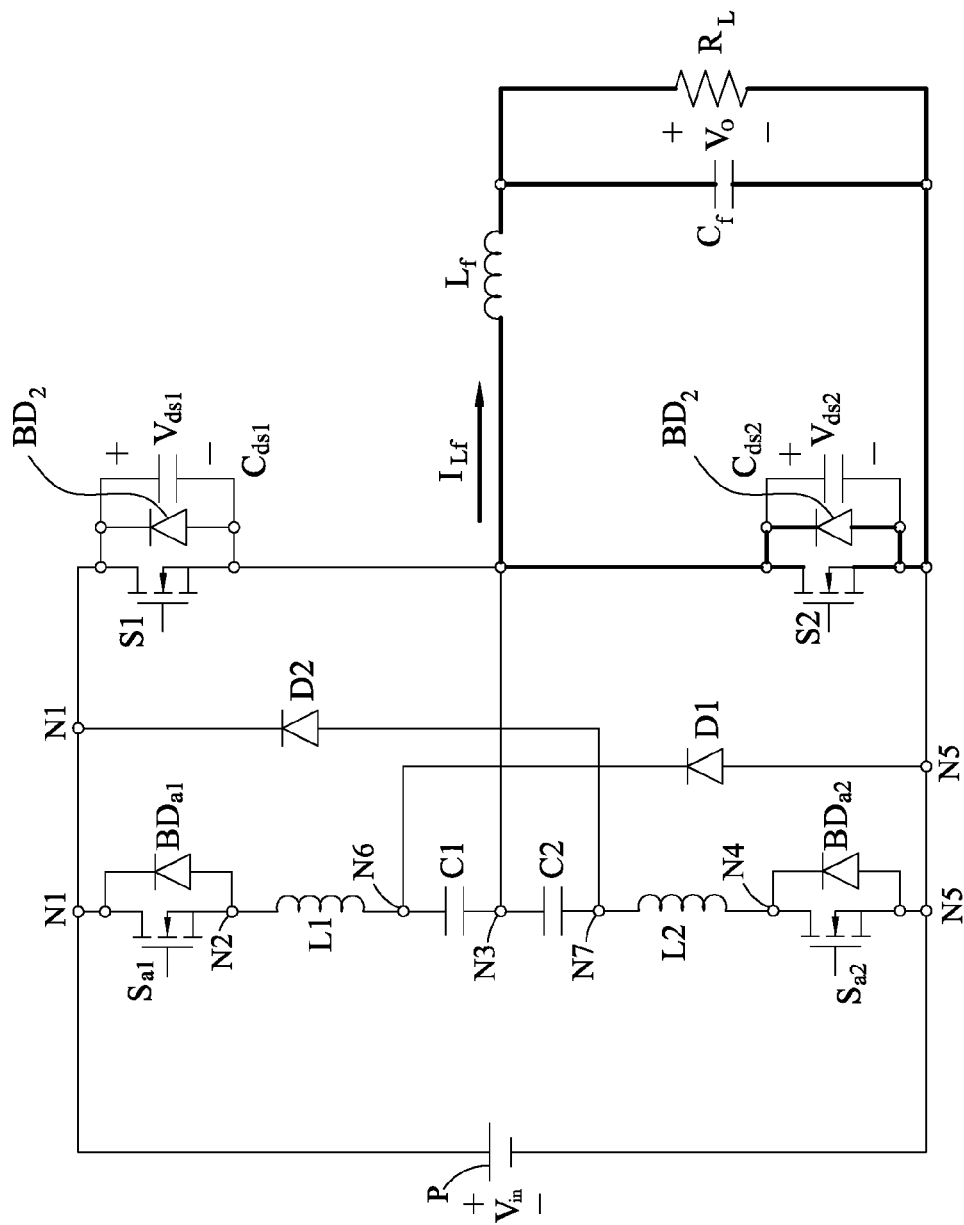
FIG. 12 is a second schematic view of a soft-switching auxiliary circuit of the third embodiment in accordance with the present disclosure.

As shown in FIG. 12, during the first stage, the capacitor $C_{ds1}$ is at the initial status; at this time, the voltage $V_{ds1}$ of the capacitor $C_{ds1}$ is the voltage $V_{in}$ of the power source P.

Figure 13:
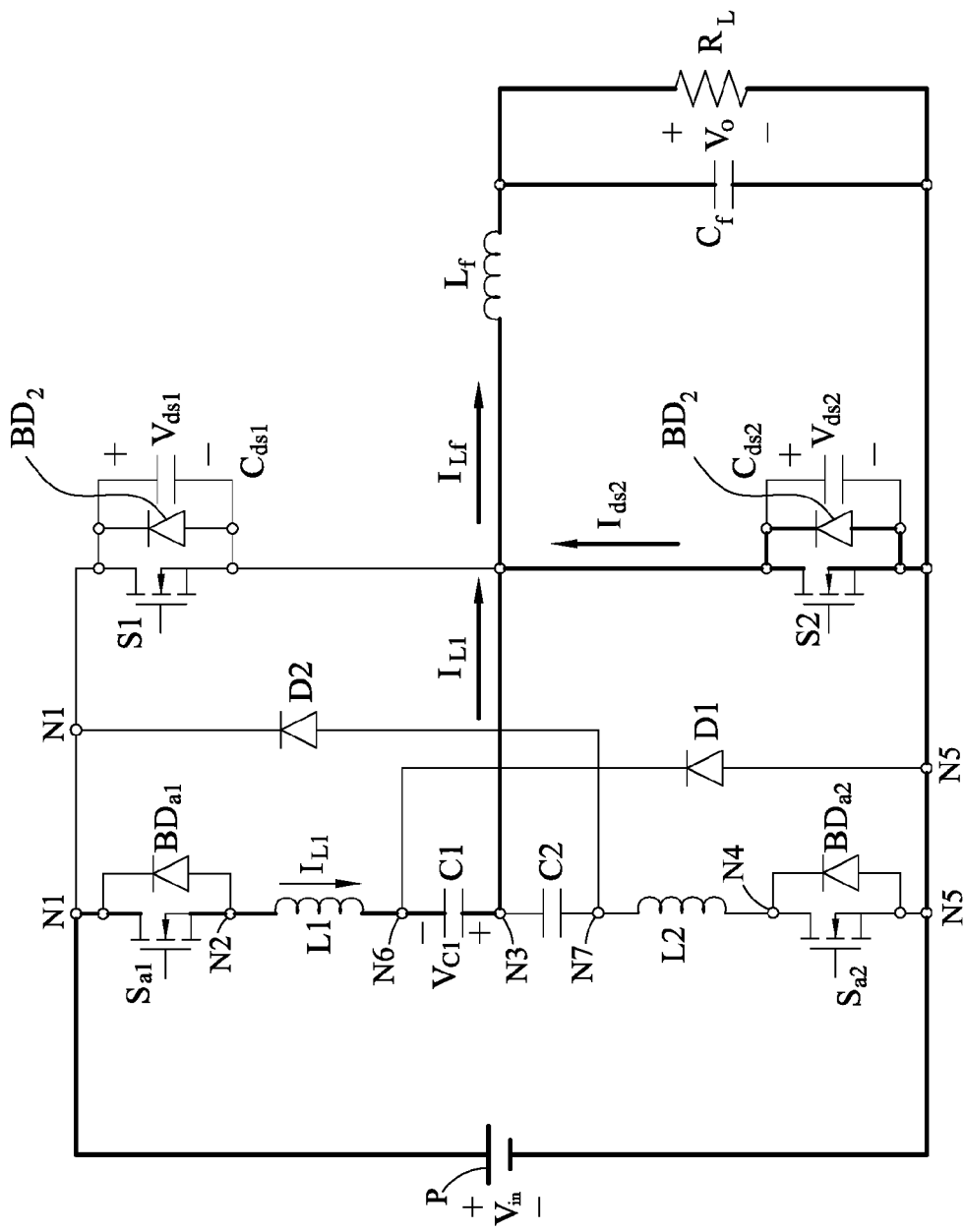
FIG. 13 is a third schematic view of a soft-switching auxiliary circuit of the third embodiment in accordance with the present disclosure.

As shown in FIG. 13, during the second stage, after the first transistor Sa1 is turned on, the voltage $V_{in}$ is applied to the first inductor L1 and the first capacitor C1, which achieves series resonance; then, the current $I_{L1}$ gradually increases; afterward, the body diode $BD_2$ of the second main switch S2 is cut off until the current $I_{L1}$ increases to be equal to the current $I_{Lf}$.

Figure 14:
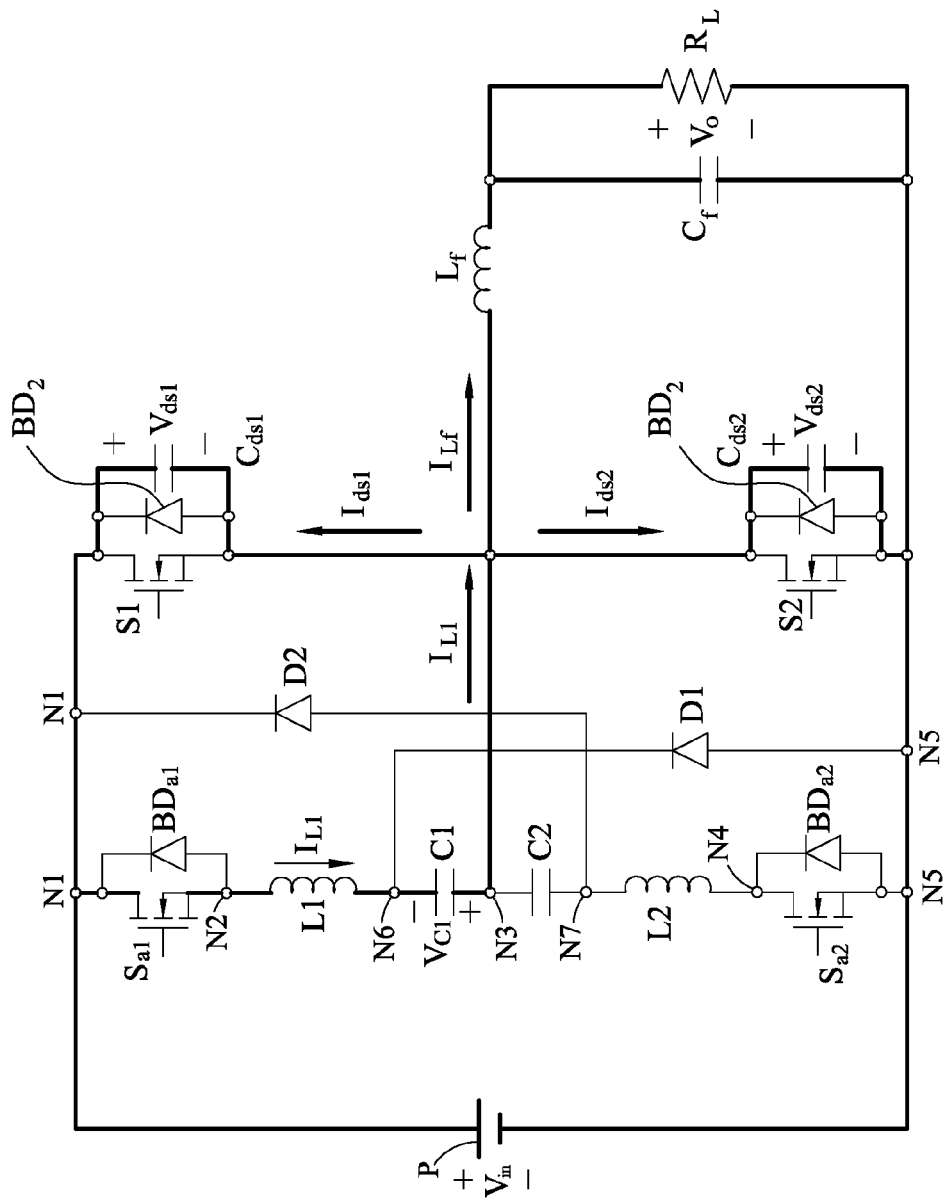
FIG. 14 is a fourth schematic view of a soft-switching auxiliary circuit of the third embodiment in accordance with the present disclosure.

As shown in FIG. 14, during the third stage, the first inductor L1, the first capacitor C1, the capacitor $C_{ds1}$ and the capacitor $C_{ds2}$ are under resonant status; the directions of the currents are as shown by the arrows in FIG. 14. Afterward, until the voltage $V_{ds1}$ of the capacitor $C_{ds1}$ decreases to be 0 and the voltage $V_{ds2}$ of the capacitor $C_{ds2}$ increases to be $V_{in}$, the body diode $BD_2$ of the first main switch S1 is turned on and then the first main switch S1 is turned on.

Figure 15:
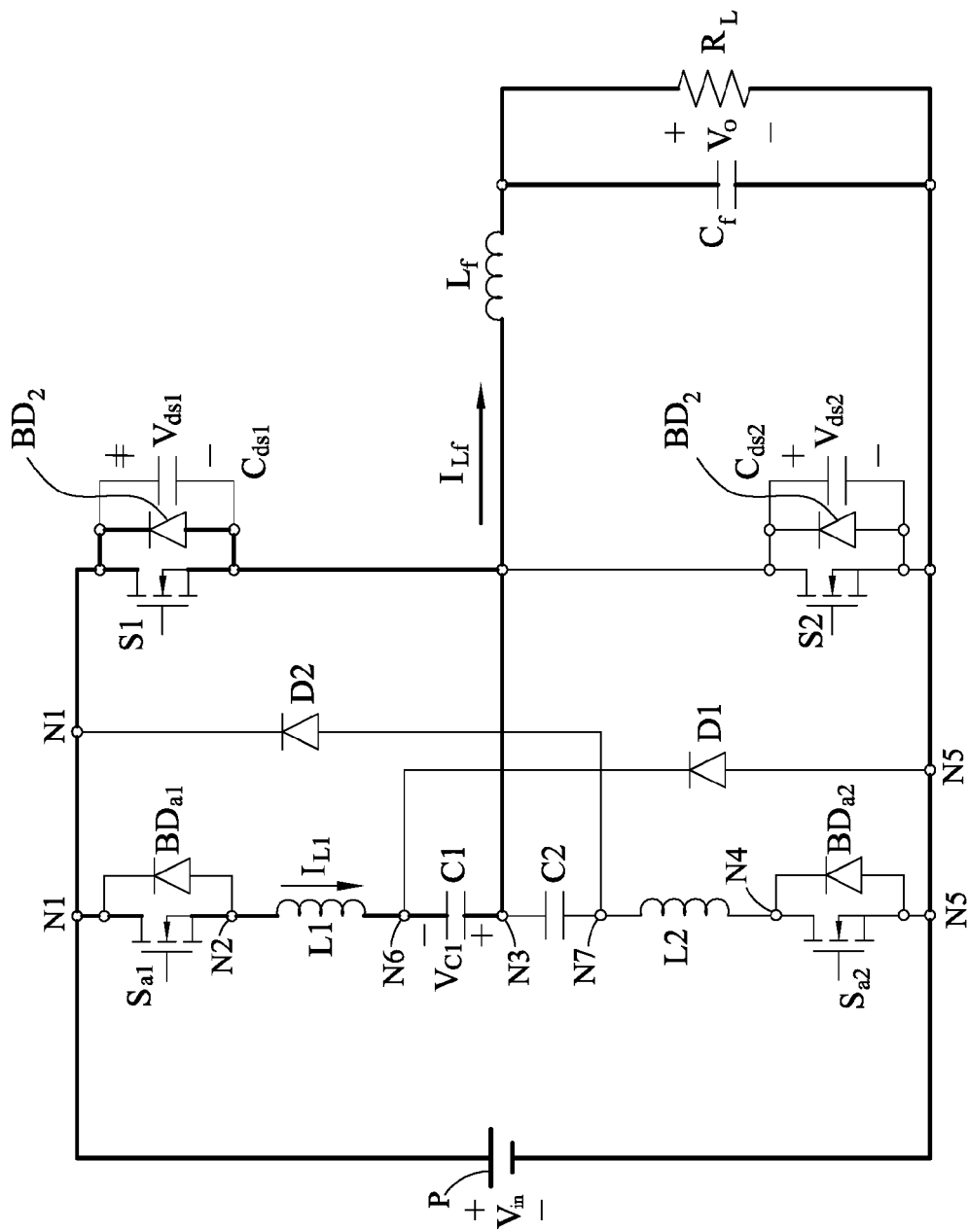
FIG. 15 is a fifth schematic view of a soft-switching auxiliary circuit of the third embodiment in accordance with the present disclosure.

As shown in FIG. 15, during the fourth stage, after the first main switch S1 is turned on, the first inductor L1 and the first capacitor C1 are short-circuited. However, as both the first inductor L1 and the first capacitor C1 have energy, the first inductor L1 and the first capacitor C1 keep resonating; at this time, the direction of the current $I_{L1}$ is as shown by the arrows in FIG. 15; after the current $I_{L1}$ decreases to be 0, the body diode $BD_{a1}$ of the first transistor $S_{a1}$ is turned on and then the first transistor Sa1 is cut off.

Figure 16:
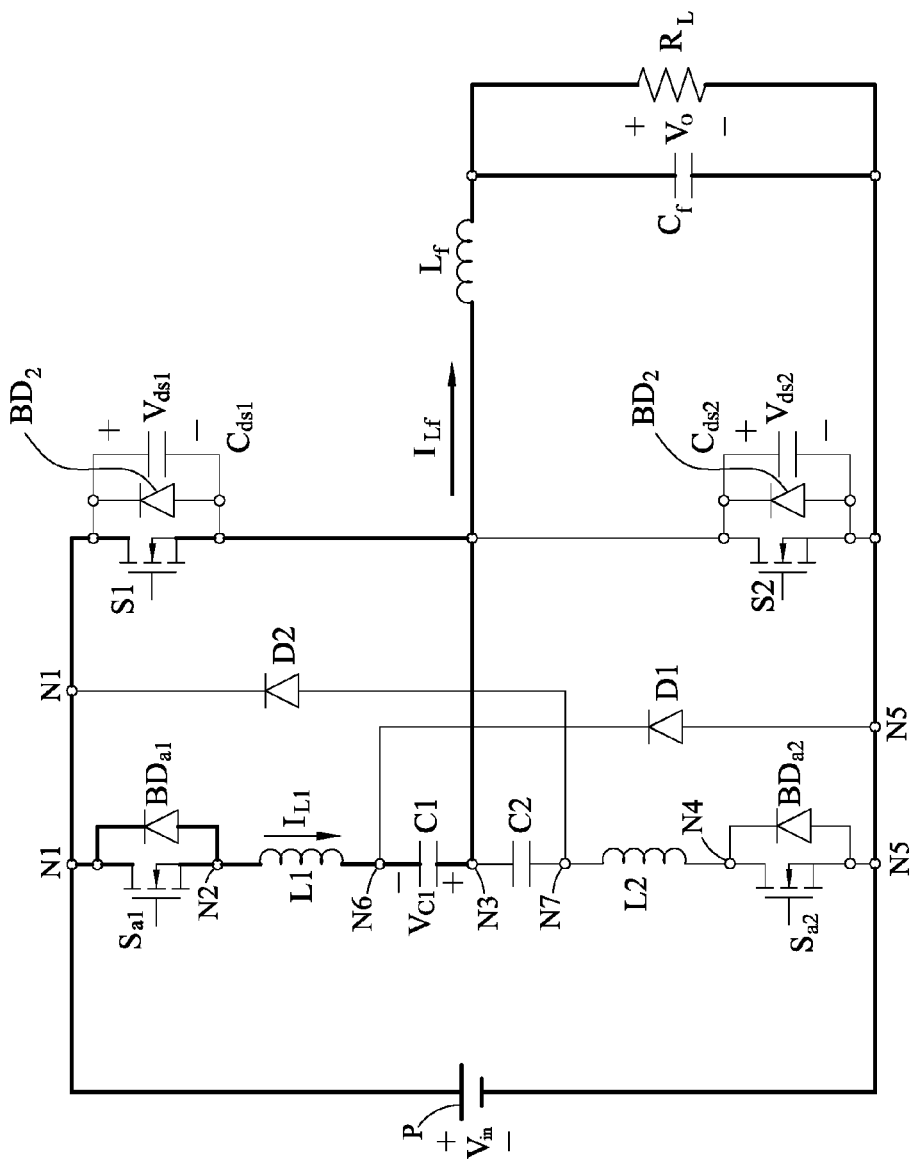
FIG. 16 is a sixth schematic view of a soft-switching auxiliary circuit of the third embodiment in accordance with the present disclosure.

As shown in FIG. 16, during the fifth stage, after the first transistor $S_{a1}$ is cut off, the current flows to the first capacitor C1, such that the first capacitor C1 can store energy; as there is no reverse path, the first capacitor C1 keeps being charged and accumulating energy.

Figure 17:
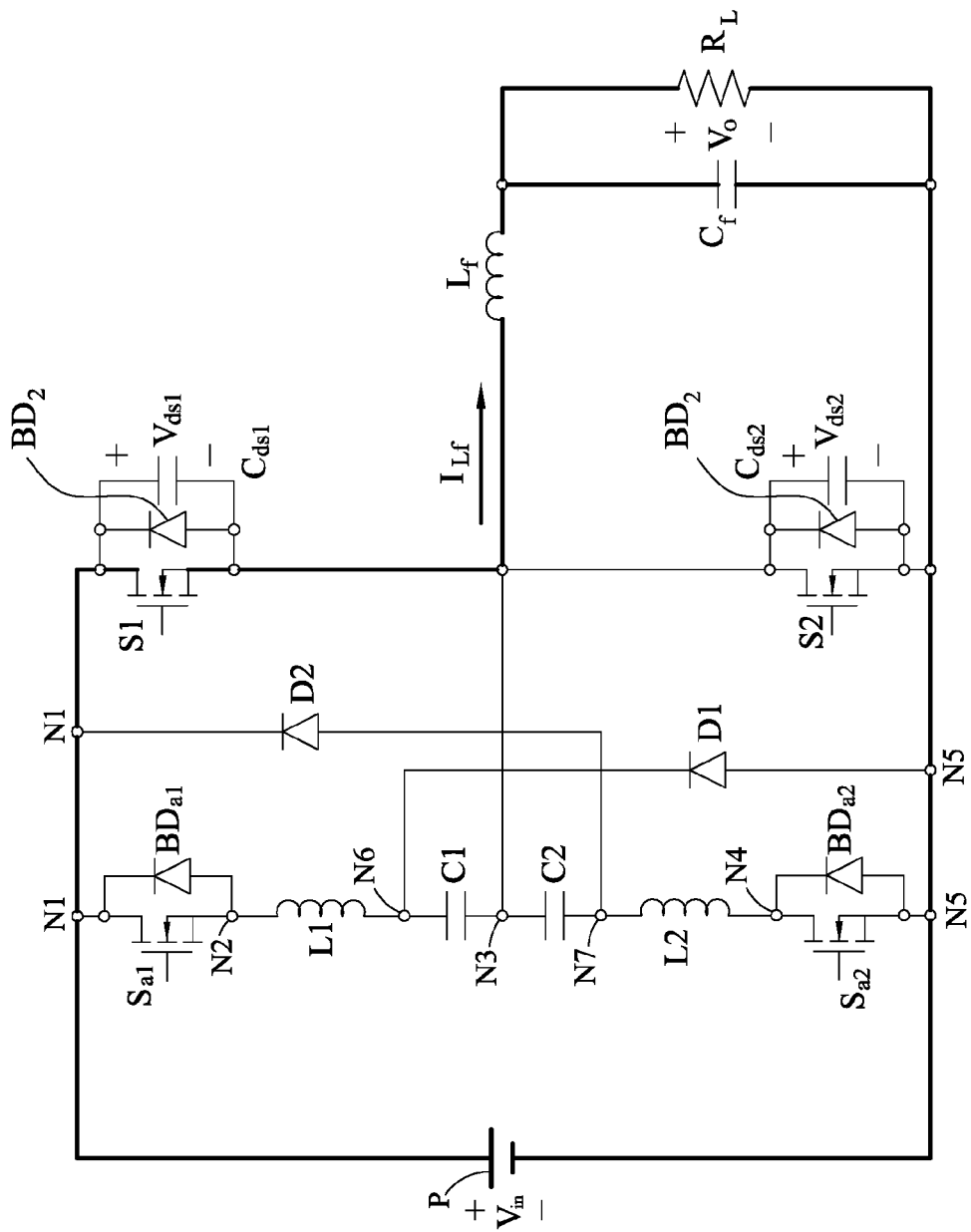
FIG. 17 is a seventh schematic view of a soft-switching auxiliary circuit of the third embodiment in accordance with the present disclosure.

As shown in FIG. 17, during the sixth stage, the first main switch S1 is turned on; at this time, the first capacitor C1 has stored enough energy.

Figure 18:
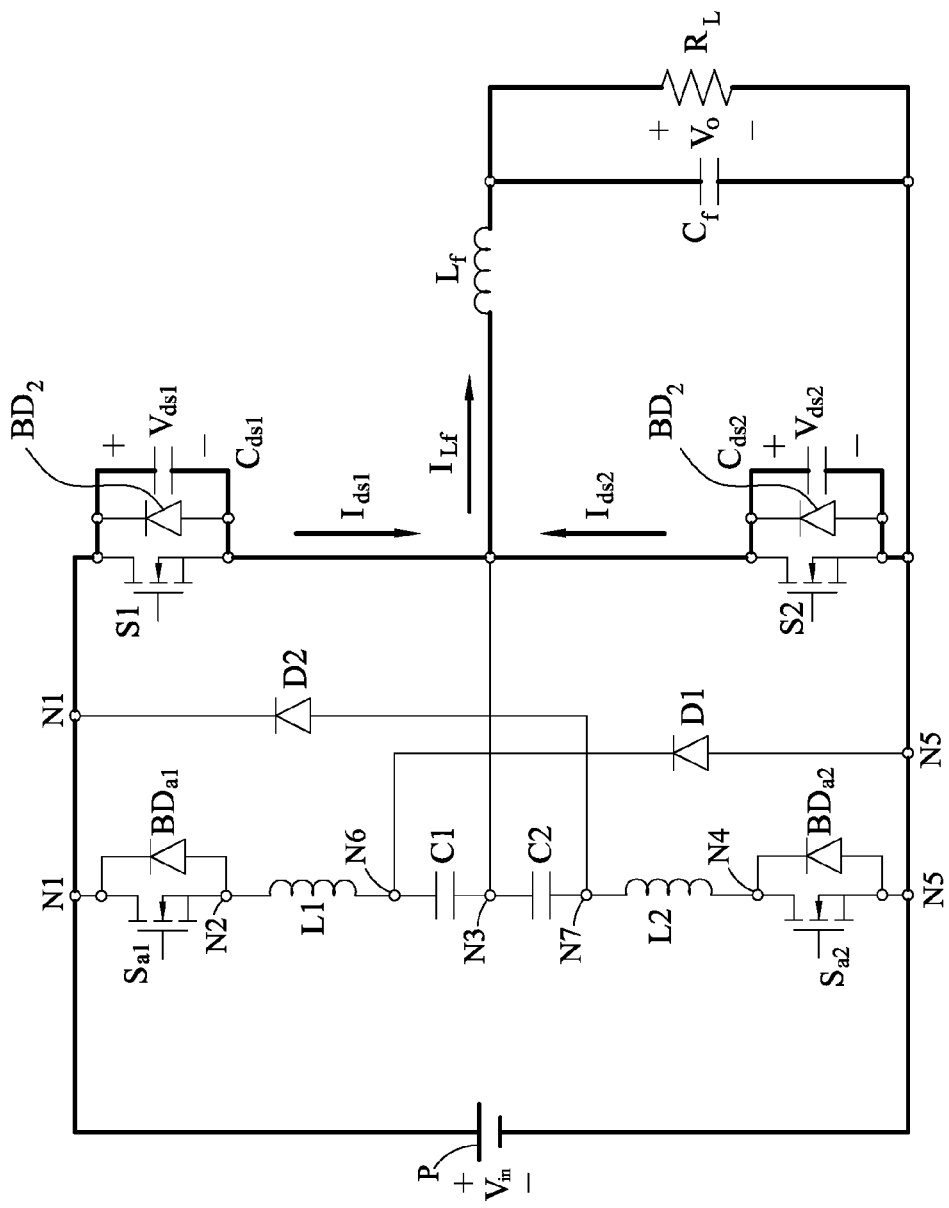
FIG. 18 is an eighth schematic view of a soft-switching auxiliary circuit of the third embodiment in accordance with the present disclosure.

As shown in FIG. 18, during the seventh stage, after the duty cycle of the first main switch S1 ends, the first main switch S1 is cut off; at this time, the directions of the currents are as shown by the arrows in FIG. 18, and the capacitor $C_{ds1}$ is being charged and the capacitor $C_{ds2}$ is being discharged.

Figure 19:
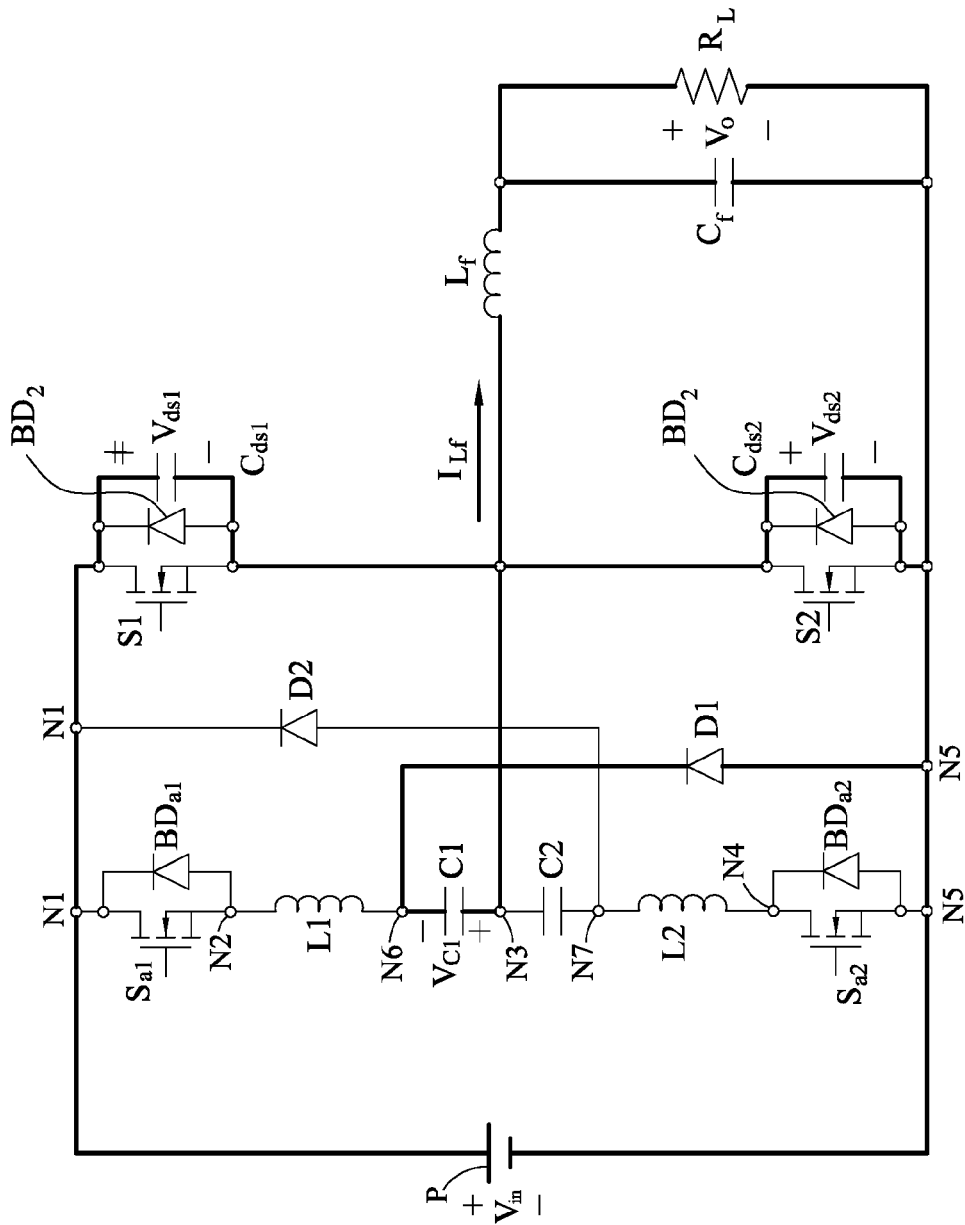
FIG. 19 is a ninth schematic view of a soft-switching auxiliary circuit of the third embodiment in accordance with the present disclosure.

As shown in FIG. 19, during the eighth stage, until the voltage $V_{ds2}$ of the capacitor $C_{ds2}$ decreases to be equal to the voltage $V_{C1}$ of the first capacitor C1, the first diode D1 is turned on. On the other hand, the first capacitor C1 and the capacitor $C_{ds2}$ keep outputting energy; afterward, the body diode $BD_2$ of the second main switch S2 is turned on until the energy of the first capacitor C1 and the capacitor $C_{ds2}$ is exhausted; then, the circuit returns to the first stage. The operation process of the second man switch S2 is similar to the above process, so will be described herein.

As described above, by means of the soft-switching auxiliary circuit 1, both the first main switch S1 and the second main switch S2 of the half-bridge converter 2 can achieve soft-switching to minimize the switching loss; therefore, the performance of the half-bridge converter 2 can be significantly improved.

In addition, the quantity of the electronic components of the soft-switching auxiliary circuit 1 of the embodiment can be further decreased, but the circuit 1 can still achieve great effect; accordingly, the cost of the soft-switching auxiliary circuit 1 can be further reduced. The above circuit structure is just an example instead of a limitation; the soft-switching auxiliary circuit 1 may have different circuit structures.

It is worthy to point out that the circuits of most currently available soft-switching auxiliary circuits should be composed of a large number of electronic components, which will significantly increase the cost of these soft-switching auxiliary circuits. On the contrary, according to one embodiment of the present disclosure, the soft-switching auxiliary circuit may be composed of few electronic components but can still achieve high performance; therefore, the cost of the soft-switching auxiliary circuit can be further reduced.

In summation of the description above, the soft-switching circuit according to the exemplary embodiments of the present disclosure may have the following advantages:

(1) According to one embodiment of the present disclosure, the soft-switching auxiliary circuit may include two auxiliary switches and two energy adjustment modules, which may form a bidirectional structure; therefore, the soft-switching auxiliary circuit can be more comprehensive in use.

(2) According to one embodiment of the present disclosure, the soft-switching auxiliary circuit may be integrated into a converter without a transformer; therefore, the size and the cost of the soft-switching auxiliary circuit can be effectively reduced.

(3) According to one embodiment of the present disclosure, the soft-switching auxiliary circuit may be integrated with the original circuit of a converter; therefore, it is not necessary to redesign the circuit of the converter; accordingly, the soft-switching auxiliary circuit can be more convenient and universal in use.

(4) According to one embodiment of the present disclosure, the soft-switching auxiliary circuit, the soft-switching auxiliary circuit may adopt a special structure, with two auxiliary switches and two energy adjustment modules; the special structure can effectively prevent from voltage surge generating during the switching of the main switch of a converter; therefore, the performance of the converter can be significantly improved.

(5) According to one embodiment of the present disclosure, the soft-switching auxiliary circuit may have less electronic components but can still achieve high performance; therefore, the cost of the soft-switching auxiliary circuit can be further reduced.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A soft-switching auxiliary circuit applicable to a converter comprising a first main switch and a second main switch, and the soft-switching auxiliary circuit comprising:

a first auxiliary switch, one end of the first auxiliary switch being coupled to one end of the first main switch via a first node, wherein the first auxiliary switch comprises a first transistor, and the first transistor is a bipolar junction transistor; a collector of the first transistor is coupled to the first node, and an emitter of the first transistor is coupled to the second node;

a first energy adjustment module, one end of the first energy adjustment module being coupled to the other end of the first auxiliary switch via a second node, wherein the first energy adjustment module comprises a first inductor, a second inductor, a first capacitor, a first diode and a second diode; one end of the first inductor is coupled to the second node, and the other end of the first inductor is coupled to one end of the first capacitor via a sixth node; the other end of the first capacitor is coupled to the third node; a positive electrode of the first diode is coupled to the second node and a negative electrode of the first diode is coupled to one end of the second inductor; the other end of the second inductor is coupled to the third node; a positive electrode of the second diode is coupled to the fifth node and a negative electrode of the second diode is coupled to the sixth node;

a second energy adjustment module, one end of the second energy adjustment module being coupled to the other end of the first energy adjustment module, the other end of the first main switch, and one end of the second main switch; and a second auxiliary switch, one end of the second auxiliary switch being coupled to the other end of the second energy adjustment module via a fourth node, and the other end of the second auxiliary switch being coupled to the other end of the second main switch via a fifth node.

2. The soft-switching auxiliary circuit of claim 1, wherein the first energy adjustment module and the second energy adjustment module are DC-link resonant circuits.

3. The soft-switching auxiliary circuit of claim 1, wherein the converter is a half-bridge converter.

4. The soft-switching auxiliary circuit of claim 1, wherein the second energy adjustment module comprises a third inductor, a fourth inductor, a second capacitor and a third diode.

5. The soft-switching auxiliary circuit of claim 4, wherein one end of the second capacitor is coupled to the third node, and the other end of the second capacitor is coupled to one end of the third inductor via a seventh node; the other end of the third inductor is coupled to the fourth node; a positive electrode of the second diode is coupled to the third node, and a negative electrode of the second diode is coupled to one end of the fourth inductor; the other end of the fourth inductor is coupled to the fourth node.

6. The soft-switching auxiliary circuit of claim 5, wherein the second energy adjustment module further comprises a fourth diode; a negative electrode of the fourth diode is coupled to the first node, and a positive electrode of the fourth diode is coupled to the seventh node.

7. The soft-switching auxiliary circuit of claim 6, wherein the second auxiliary switch comprises a second transistor, and the second transistor is a bipolar junction transistor; a collector of the second transistor is coupled to the fourth node, and an emitter of the second transistor is coupled to the fifth node.

8. A soft-switching auxiliary circuit applicable to a converter comprising a first main switch and a second main switch, and the soft-switching auxiliary circuit comprising:

a first auxiliary switch, comprising a first transistor, and the first transistor is a field-effect transistor; a drain of the first transistor is coupled to a first node, and a source of the first transistor is coupled to a second node;

a first energy adjustment module, comprising a first inductor and a first capacitor, wherein one end of the first inductor is coupled to the second node; one end of the first capacitor is coupled to a third node;

a second energy adjustment module, one end of the second energy adjustment module being coupled to the other end of the first energy adjustment module, the other end of the first main switch, and one end of the second main switch; and a second auxiliary switch, one end of the second auxiliary switch being coupled to the other end of the second energy adjustment module via a fourth node, and the other end of the second auxiliary switch being coupled to the other end of the second main switch via a fifth node;

wherein the first energy adjustment module further comprises a second diode; a positive electrode of the first diode is coupled to the fifth node, and a negative electrode of the first diode is coupled to a sixth node; the other end of the first inductor is coupled to the other end of the first capacitor via the sixth node.

9. The soft-switching auxiliary circuit of claim 8, wherein the second energy adjustment module comprises a second inductor and a second capacitor.

10. The soft-switching auxiliary circuit of claim 9, wherein one end of the second capacitor is coupled to the third node, and the other end of the second capacitor is coupled to one end of the second inductor via a seventh node; the other end of the second inductor is coupled to the fourth node.

11. The soft-switching auxiliary circuit of claim 10, wherein the second energy adjustment module further comprises a second diode; a positive electrode of the second diode is coupled to the seventh node, and a negative electrode of the second diode is coupled to the first node.

12. The soft-switching auxiliary circuit of claim 11, wherein the second auxiliary switch comprises a second transistor, and the second transistor is a field-effect transistor; a drain of the first transistor is coupled to the fourth node, and a source of the second transistor is coupled to the fifth node.

* * * * *